United States Patent [19]

Parker et al.

[11] 4,333,035
[45] Jun. 1, 1982

[54] AREAL ARRAY OF TUBULAR ELECTRON SOURCES

[75] Inventors: Donald L. Parker; Wilbur A. Porter; Robert C. Rogers, all of College Station, Tex.

[73] Assignee: Woodland International Corporation, Panama, Panama

[21] Appl. No.: 34,984

[22] Filed: May 1, 1979

[51] Int. Cl.³ .................. H01J 29/46; H01J 29/70
[52] U.S. Cl. .................. 313/411; 313/310; 313/422; 313/495; 219/121 EB
[58] Field of Search ........... 313/414, 422, 495, 409, 313/413, 341, 339, 346 R, 310, 411; 219/121 EB

[56] References Cited

U.S. PATENT DOCUMENTS

| | | | |
|---|---|---|---|
| 1,955,537 | 4/1934 | Davies | 313/339 |
| 2,321,149 | 6/1943 | Koch | 313/339 X |
| 2,558,019 | 6/1951 | Toulon | |
| 2,581,243 | 1/1952 | Dodds | 313/338 |
| 2,614,942 | 10/1952 | Loosjes et al. | 313/341 |
| 2,635,201 | 4/1953 | Rajchman | 313/6 |
| 2,640,162 | 5/1953 | Espenschied et al. | 313/414 X |
| 2,965,801 | 12/1960 | Archer et al. | 315/169 |
| 2,972,719 | 2/1961 | Michlin | |
| 3,091,719 | 5/1963 | Dyke et al. | |
| 3,107,303 | 10/1963 | Berkowitz | 313/495 X |
| 3,128,408 | 4/1964 | Goodrich et al. | 313/103 |
| 3,341,730 | 9/1967 | Goodrich et al. | 313/103 |
| 3,363,240 | 1/1968 | Cola et al. | |
| 3,432,668 | 3/1969 | Davy et al. | |
| 3,458,748 | 7/1969 | Hieslmair | 313/346 |
| 3,686,727 | 8/1972 | Say et al. | |
| 3,882,355 | 5/1975 | De Witt | 315/169 |
| 3,928,783 | 12/1975 | Hosoki et al. | 313/270 |
| 3,934,167 | 1/1976 | Ponsen et al. | 313/209 X |
| 3,935,500 | 1/1976 | Oess et al. | 313/495 |
| 3,982,147 | 9/1976 | Redman | 313/309 |
| 4,020,381 | 4/1977 | Oess et al. | 313/302 |

*Primary Examiner*—Palmer C. Demeo
*Attorney, Agent, or Firm*—Richards, Harris & Medlock

[57] ABSTRACT

An areal array of tubular electron sources is disclosed for producing multiple directed electron beams. Sources (10) are located in a parallel array between a conductive back plate (12) at a closed end of the tubes and a conductive face plate (14) having holes therein aligned with the second open end of each of the electrode tubes (10). An electrical current source (30) is connected between the back plate (12) and face plate (14) to resistively heat each of the sources (10) to a temperature high enough for thermionic electron emission. Electron beams (34) are produced from within each of the tubular electrodes (10). Extraction means which may include a magnetic field from a coil (29) and an extraction lens (18) tends to withdraw the electrons from within the sources (10) in an intense, collimated beam (34). Beams (34) are accelerated toward a target (28) through a beam deflection unit (22) having holes (24) associated with each of the electron beams (34). Beam deflection plates (26) within each of the holes (24) deflect the electron beams (34) to impact selected points on a target (28).

16 Claims, 3 Drawing Figures

ABOUT 4,333,035

AREAL ARRAY OF TUBULAR ELECTRON SOURCES

TECHNICAL FIELD

This invention relates to electron beam generation, and more particularly to the simultaneous generation of multiple electron beams from a plurality of tubular cathodes.

BACKGROUND ART

Electron beam lithography technology has been developed for the production of monolithic integrated circuits by means of writing an electron beam on an electron resist coated target wafer to expose selected areas of the wafer. Electrons are typically produced in such a system by thermionic emission and are formed into a beam by electrostatic and magnetic accelerating and focusing elements. The point of impact of the beam on the target is controlled by deflecting electrodes which bend the beam by means of electrostatic fields. In previous systems a single electron beam is produced which is sequentially directed to a plurality of discrete areas on the wafer.

A multielectron beam generation system is disclosed in U.S. Pat. No. 3,935,500 to Oess et al. In Oess each of the electron beams is generated and deflected in response to a modulating signal to produce a display on a phosphor screen. Each electron beam is generated by a cathode wire which is heated by current flow to produce electrons by thermionic emission.

Prior art electron generators have used an electron emissive wire electrode which is heated to the thermionic emission temperature by a heater element. However, electron beam generation in this manner does not produce a beam intensity sufficient for many applications. Further, such a structure does not lend itself to implementation as a multiple electron beam generator.

A need therefore exists for a multiple electron beam generator capable of producing intense small sources of electrons. A need also exists for an electron beam generator which can produce a source of electrons that are in a collimated beam which can be readily focused and deflected.

DISCLOSURE OF THE INVENTION

In accordance with the present invention, an areal array of tubular electron sources is provided for generating a plurality of intense, collimated electron beams.

The thermionic electrode structure of the present invention, which is utilized for producing multiple electron beams, comprises a plurality of tubular, electron emissive electrodes aligned in a parallel array with each of the electrodes closed at a first end and opened at a second end. Each of the tubes is resistively heated by either AC or DC current flow through the tube such that the tube is heated to a temperature wherein electrons are produced by thermionic emission. An additional extraction lens is provided in the form of a positively biased plate having holes therein registered with the openings of the tubular electrodes to extract and focus the electrons generated from within the tubular electrodes. The electrons thus produced are in a collimated beam and are accelerated, focused, and deflected onto a selected target.

In accordance with a further aspect of the present invention a plurality of discrete electron beams is produced by the combination comprising a conductive back plate together with a conductive face plate having an array of holes formed therein. A plurality of parallel tubular electrodes are disposed to extend between the back and face plates and are closed at one end to the back plate and open at a second end to align with the holes in the face plate. A power source is connected between the back face plates to produce a current flow through the tubular electrodes so as to resistively heat the electrodes to the thermionic emission state. A magnetic extraction lens concentrically aligned with the tubular array may be used to direct thermionically produced electrons out of the end of the tubular electrodes of the array. The extraction lens comprising the above mentioned plate having an array of holes registered with the tubular electrodes is located parallel to and spaced apart from the face plate for extracting electrons which have been released within the electrode tubes. A voltage source biases the extraction lens relative to the plate to produce a collimated beam of electrons from within the tubular electrodes.

BRIEF DESCRIPTION OF THE DRAWINGS

A more complete understanding of the invention and its advantages will be apparent from the following detailed description taken in conjunction with the accompanying drawings in which.

DETAILED DESCRIPTION

Figure 1:
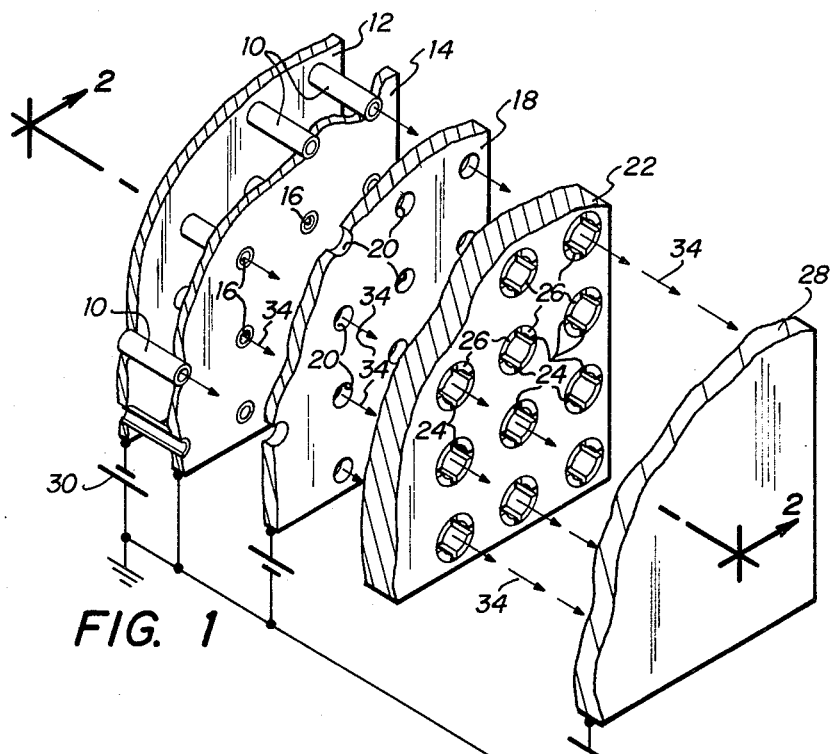
FIG. 1 is a cut-away isometric view of an array of tubular electron sources of the present invention.
Figure 2:
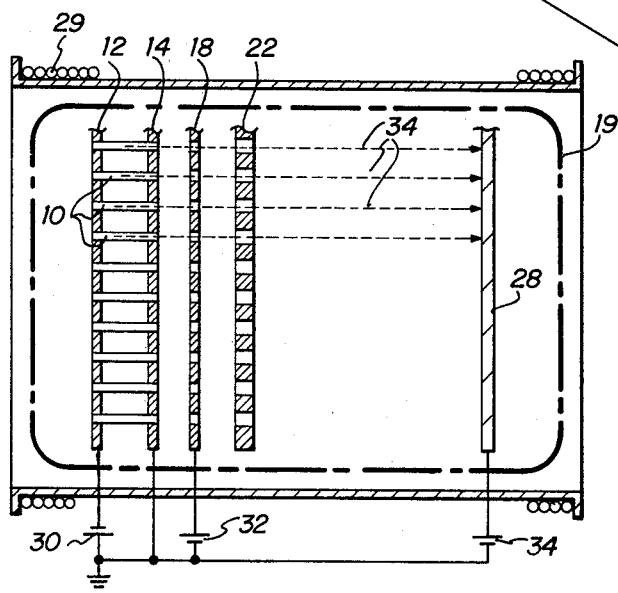
FIG. 2 is a sectional elevation view of the array of tubular electron sources of the present invention.

The multiple electron beam generator of the present invention is illustrated in FIGS. 1 and 2. Electron beams are generated within each of a plurality of tubes 10. Tubes 10 are arranged with axes parallel and mounted in a rectangular array between a pair of conductive plates. A back plate 12 is located normal to the axes of the tubes 10 and is joined to the tubes so that each of the tubes is sealed by plate 12. A face plate 14 is also normal to the axes of tubes 10 and is located at the open ends of each of the tubes. By way of example, tubes 10 of tantalum and plates 12 and 14 of copper may be employed.

Face plate 14 has an array of holes 16 formed therein to receive or otherwise register with the open ends of the tubes 10. Preferably each of tubes 10 extends into a hole 16 in the face plate 14. Thus, the tubes 10 are closed at the end adjacent the back plate 12 and open at the end connected to the face plate 14.

An extraction lens 18 comprises a copper plate which is parallel to face plate 14 but spaced outward therefrom. The extraction lens 18 comprises a flat plate with an array of holes 20 which are aligned with the axes of tubes 10.

Spaced still further from the extraction lens 18 is a beam deflection unit 22 having an array of holes 24. Each of the holes 24 is aligned coaxially with one of tubes 10 and therefore is in alignment also with one of the holes 20 in the extraction lens 18. Each of the holes 24 has pairs of x and y deflection plates 26 included therein.

A target 28 is located on the side of the extraction lens 18 opposite the beam deflection unit 22. In use in connection with electron beam lithography, target 28 may comprise a silicon wafer or other semiconductor target. Such targets are used in manufacture of a plurality of identical monolithic integrated circuits. The electron beams produced by the electron beam generator of FIG. 1 serve to expose various points on target 28 to further the fabrication of the integrated circuits thereon. Typically, each electron beam may be dedicated to one of the integrated circuits to be formed on target 28 in which case exposure of all circuits may be conducted simultaneously. This is in contrast to the prior art technique in which a single electron beam is generated and the single beam is used to sequentially establish replicated circuit patterns on the target 28.

Target 28 may comprise a phosphor screen which is caused to luminesce under the impact of the electron beams. A display is produced on such target 28 by appropriate modulation of the electron beams and deflection plates 26 in the deflection unit 22.

A power source 30 is provided to produce a voltage which is applied between plates 12 and 14. A DC source 32 is connected between the face plate 14 and the extraction lens 18 to bias the extraction lens positive relative to the face plate 14. A DC source 34 provides a bias which raises the voltage of target 28 to a very high level with respect to the face plate 14 so as to accelerate the electron beams thus produced to cause a high energy impact on the target.

The electron beams are produced from within the tubular electrodes and are illustrated by arrows 34. The structure described is housed in an evacuated chamber represented by the enclosure 19. A vacuum of at least $10^{-5}$ TORR is employed. As shown in FIG. 2, the structure of FIG. 1 as housed in evacuated enclosure 19 is positioned as to be operated in a magnetic field. More particularly, a coil 29 is energized from a suitable unidirectional source (not shown) in order to establish and maintain a magnetic field which, within the enclosure 19, is substantially uniform and has magnetic flux lines which are parallel to the axis of the beams 34. The concentrically positioned magnetic coil 29 may be used surrounding the array of tubular electrodes to direct the thermionically produced electrons out of the target end of the tubular emitters.

By heating the tantalum tubes 10 upon passage of current from source 30 therethrough electrons are emitted from the inside surfaces of the tubes 10. With the open end of the tubes at a positive potential relative to the ends closed by plate 12, there is a tendency for the electrons thus reduced to drift towards and through the open end of the tubes and be subject to the acceleration forces provided by the extraction electrode 18.

In FIGS. 1 and 2 the current source for heating the tubes 10 is shown as a DC source 30. It is to be understood that operation of the system would be predicated upon uniform flow of electrons and thus uniform heating. For the purpose of regulation of the current heating tubes 10, it will be found more readily achieved by the use of alternating current source rather than DC source 30. With a DC source, the electrons tend to move out of the tubes in response to the electrostatic field produced by a DC source. With an AC current source this tendency would be eliminated. However, the magnetic field from coil 29 would direct the thermionic electrons out of the target end of the tubes 10. It is to be understood that coil 29 is of cylindrical shape and extends preferably the length of the enclosure 19 so that the magnetic field would tend to keep the streams of electrons flowing parallel.

Operation of the present invention is described in reference to FIGS. 1 and 2. Source 30 establishes a voltage differential which is applied to the plates 12 and 14. Since plates 12 and 14 are copper sheets, they offer little resistance to the flow of electrical current. A voltage is therefore applied across each of the electrode tubes 10 to cause a current to flow therein. The current through tubes 10 heats them as resistive elements until they reach the temperature required for thermionic emission. Tubes 10 are made of a material such as tantalum which provides an abundance of free electrons when heated to the thermionic emission temperature.

Electrons produced within tubes 10 are directed toward the apertures 16 of face plate 14 due to the magnetic field of coil 29. The large surface area on the interior of each of the electrode tubes 10 increases the quantity of electrons produced through thermionic emission for outflow of electrons through the holes 16 in the face plate 14.

Source 32 biases the extraction lens 18 positive relative to the face plate 14. Since this lens has a more positive potential than that of the face plate, back plate and the included electrode tubes, it tends to pull the electrons passing out through holes 16 into the respective holes 20 in the extraction lens. The electrostatic field of the extraction lens 18 tends to accelerate the electron beams and direct them toward the beam deflection unit 22.

The electron beams 34 are directed through the holes 24 within the beam deflection unit 26. As the electron beams 34 pass through holes 24 they are deflected by the beam deflection plates 26 which are disposed in pairs offset 90° from each other. The voltage on the beam deflection plates 26 is modulated so as to deflect the electron beams 34 and cause impact on the target 28 in the desired locations.

As utilized in electron beam lithography, electron beams are directed toward a plurality of monolithic integrated circuit areas on target 28. The electron beams perform various exposure operations on target 28. In the usual case, integrated circuits produced on a semiconductor wafer are identical and are spaced as an array which may be as the dispersion of the tube 10. In production of identical integrated circuits, the same modulating signals are provided to each of the sets of deflection plates 26 in the beam deflection unit 22 so that the electron beams 34 simultaneously trace the same pattern over each of the respective integrated circuit areas.

In a display application the target 28 is a phosphor screen which produces visible light when excited by a beam of electrons. By means of the deflection circuitry each of the electron beams 34 can be directed to cover a specific area of the target screen 28. By modulating the intensity of each of the beams and the deflection plates 26 an image can be produced on the target 28. A significant advantage of the present invention in image production over that of prior systems is that the total display unit can be made to be extremely thin. In previous units being conventional cathode ray tubes, the depth of the tube is generally approximately equal to the diameter of the display. But in the present invention the depth can be made very small in relation to the diameter of the display. This is made possible by the plurality of electron beam sources with each source being deflected to cover only a small area of the screen.

In the embodiment shown, tantalum tubes having an internal diameter of 0.006 inch were employed. Tubes 10 are spaced on a square array with the axes of spaced tubes separated by a grid distance typically of 0.100 inch. The plates 12, 14 and extraction lens 18 are typically constructed of thin copper sheets.

Tubes 10 preferably have a length of ½ inch and are disposed in a 30×30 array. This would be suitable for use with a three-inch (7.6 cm) semiconductor wafer.

The ratio of the length to diameter of the electrode tubes is particularly significant in regard to the production and collimation of the electron beam. The number of electrons produced is proportional to the surface area of the emitter. Therefore, the electron production is proportional to the product of the internal diameter and length of the tubes 10. In this regard, the greater the length the greater the production of electrons; however, if the length is made too great the electrons thus produced will impinge the interior walls of the tube and reduce the effectiveness of electron production. The greater length of the tube tends to cause the electrons which are removed to travel in a beam having a relatively small beam width. The width of the beam is reduced with the increase in length of the electrode tube. Coil 29 external to the tubular array and concentrically aligned with the tubular array produces a constant magnetic field in each tube which directs some of the thermionically produced electrons out of the end of each tube 10. The combination of optimum tube length and an electric field tends to create an electron beam that appears to originate from an infinitely distant source.

It has been found that the optimum length of the tube for producing an intense, collimated beam of electrons is a critical function of the internal diameter of the tube. A greater length results in increased internal collision of electrons with the tube causing decreased efficiency of electron production while a shorter length produces a less tightly collimated electron beam.

Figure 3:
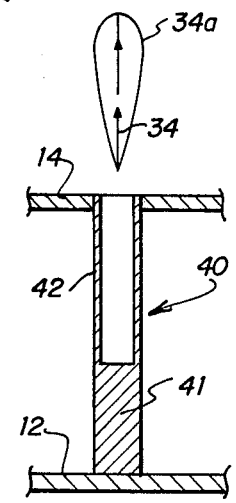
FIG. 3 is a sectional view showing a preferred source construction.

Having described the invention in connection with the use of tantalum tubes, reference may now be had to FIG. 3 wherein a preferred embodiment of the invention is shown insofar as the electron source is concerned. In FIG. 3, the source, rather than being of tubular shape, is shown to comprise a deep, slender, thin-walled cup 40 having a solid cylindrical bottom portion 41 and an upper hollow section having thin walls 42. Preferably, the cup 40 is made of a material having a surface preferential emission direction. One such material is lanthanum-hexaboride. The electron source 40 of FIG. 3 is mounted with the base 41 in contact with the back plate 12 and with the mouth of the cup secured in a hole in the front plate 14. The crystal structure of the source 40 is such that it has preferential electron emission in the direction of arrow 34. It is to be understood that an emission pattern 34a may be considered to be typically representative of radiation from such a crystal surface when at a suitable elevated temperature. With such an emission characteristic electron emission from the lip of the cup, the bottom of the cup, as well as the inner walls of the cup, would be effective in the formation of the electron beam passing out of the mouth of the cup 40.

Although several embodiments of the invention have been illustrated in the accompanying drawings and described in the foregoing detailed description, it will be understood that the invention is not limited to the embodiments disclosed, but is capable of numerous rearrangements, modifications and substitutions without departing from the scope of the invention.

We claim:

1. A structure for generating multiple electron beams comprising in combination:
   (a) a plurality of hollow tubular electron emitter units aligned with parallel axes, each of said units closed at one end and open at the opposite end thereof,
   (b) means for causing heating current to flow along the length of said tubular units for heating said units to produce thermionic electron emission inside said units, and
   (c) means for directing said electrons from the interior of said units to produce collimated beams of electrons axially from said open ends of said units.

2. Structure for generating multiple electron beams as recited in claim 1 wherein said means for heating comprises a power source connected for parallel current flow through all of said units for resistive heating thereof.

3. Structure for generating multiple electron beams as recited in claim 1 wherein said means for directing comprises means for establishing a magnetic field parallel to the axes of said units and a conductive plate normal to the axes of said units and spaced from the open ends thereof, said plate having an array of holes therein coaxial with said units and having a positive electrostatic bias with respect to said units for attracting said electrons from within said units and directing said electrons through said holes in said plate.

4. Structure for generating multiple electron beams as recited in claim 1 wherein the length of said units is at least ten times the internal diameter thereof.

5. Structure for generating multiple electron beams as recited in claim 1 including a deflection unit comprising a plate having holes therein coaxial with the axes of said units for passage through each hole of one of said electron beams, each said hole having orthogonal electrostatic deflection plates associated therewith for deflecting the electron beam passing therethrough.

6. Structure for generating multiple electron beams as recited in claim 1 including a target for receiving said electron beams, said target having a positive electrostatic bias relative to said units for accelerating said electrons toward said target.

7. Apparatus for producing a plurality of discrete electron beams, comprising in combination:
   (a) an electrically conductive back plate,
   (b) an electrically conductive face plate having a first array of holes therein,
   (c) a plurality of parallel tubes extending between said back plate and said face plate, a first end of each of said tubes closed and joined to said back plate and a second end of each of said tubes open and aligned with one of said holes in said face plate, said tubes contacting said face plate,
   (d) means for causing heating current to flow along the length of said tubes for heating said tubes to produce thermionic electron emission therefrom,
   (e) an extraction lens comprising a plate having a second array of holes therein registering with said first array, said extraction lens parallel to and spaced apart from said face plate opposite said back plate, and
   (f) means for electrostatically biasing said extraction lens relative to said tubes to produce a collimated beam of electrons from within each of said tubes.

8. The combination of claim 7 in which said tubes are of material having surface preferential emission in the direction axially from said tubes toward said lens.

9. The combination of claim 7 in which means are provided for establishing a magnetic field parallel to said tubes to control the direction of travel of said electrons from said tubes.

10. Apparatus as recited in claim 7 wherein said means for heating comprises an electrical current source having a first terminal thereof connected to said back plate and a second terminal thereof connected to said face plate, said tubes being resistively heated by current flow therethrough.

11. Apparatus as recited in claim 7 including a target for receiving said electrons, said target having a positive electrostatic bias relative to said tubes for accelerating said electrons toward said target.

12. Apparatus for producing a plurality of directed electron beams for simultaneous impact on a target comprising in combination:
   (a) a parallel array of tantalum tubes,
   (b) a first conductive plate joined to an end of each of said electrodes and closing said one end thereof,
   (c) a second conductive plate joined to the open end of each of said electrodes, said second plate having an array of holes therein aligned with and open to each of said electrodes,
   (d) an electrical current source connected between said first and said second plates for causing heating current to flow along the length of each of said tubes resistively to heat said tubes to produce thermionic emission of electrons therefrom,
   (e) means to establish a magnetic field parallel to said tubes to control the direction of travel of said electrons from said tubes,
   (f) a lens unit comprising a conductive plate spaced from and parallel with said second plate, said lens unit having an array of holes with one of said holes aligned with the axis of each of said tubes,
   (g) a direct current source connected to electrostatically bias said lens unit positive relative to said second plate to attract electrons from said electrodes and direct said electrons through said holes in said lens unit,
   (h) a direct current source electrostatically biasing said target positive relative to said tubes to accelerate said electrons toward said target, and
   (i) a third plate having an array of deflection holes therein aligned with the axes of said tubes, each of said beams passing through one of said deflection holes, each of said deflection holes having electrostatic deflection electrodes therein for directing the electron beam passing therethrough to a selected point on said target.

13. In electron beam lithography where a semiconductor target wafer is exposed by a directed electron beam in producing a monolithic semiconductor device, apparatus for simultaneously producing a plurality of directed electron beams comprising in combination:
   (a) a plurality of tubular, electron-emissive units aligned in a parallel array, each of said units closed at one end and open at the opposite end,
   (b) means for heating said units to produce thermionic emission of electrons,
   (c) means for extracting said electrons from the interior of said units through said open end thereof to generate a collimated electron beam from each of said units,
   (d) means for accelerating each of said electron beams toward said wafer,
   (e) means for focusing each of said electron beams, and
   (f) means for deflecting each of said electron beams to expose selected points on said wafer.

14. The combination set forth in claim 13 wherein the extracting means cooperates with means for establishing a magnetic field which encompasses said array in parallel relation to the axes of said units to control direction of travel of said beams.

15. The combination set forth in claim 13 wherein the extracting means comprises crystal structure in said units having surface preferential emission direction axial of said units and away from said closed ends.

16. In a display system where an electron beam impacts a phosphor sceen to produce luminance, apparatus for simultaneously producing a plurality of directed electron beams to create an image on the screen comprising in combination:
   (a) a plurality of tubular, electron-emissive units aligned in a parallel array, each of said units closed at one end and open at the opposite end,
   (b) means for heating said units to produce thermionic emission of electrons,
   (c) means for extracting said electrons from the interior of said units through said open end thereof to generate a collimated electron beam from each of said units,
   (d) means for accelerating each of said electron beams toward said screen,
   (e) means for focusing each of said electron beams, and
   (f) deflection means for aiming each of said electron beams to desired points on the surface of said screen to produce said image.

* * * * *